(12) United States Patent
Hill

(10) Patent No.: US 8,679,932 B1
(45) Date of Patent: Mar. 25, 2014

(54) SYSTEM AND METHOD FOR MANUFACTURING THIN FILM RESISTORS USING A TRENCH AND CHEMICAL MECHANICAL POLISHING

(75) Inventor: Rodney Hill, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 1361 days.

(21) Appl. No.: 11/343,042

(22) Filed: Jan. 30, 2006

Related U.S. Application Data

(62) Division of application No. 10/912,659, filed on Aug. 5, 2004, now Pat. No. 7,291,525.

(51) Int. Cl.
*H01L 29/72* (2006.01)

(52) U.S. Cl.
USPC ........... 438/359; 438/383; 438/384; 438/618; 257/347

(58) Field of Classification Search
USPC .......... 257/359, 380, 536, 537; 438/383, 384, 438/618, 622, 190, 192, 645
See application file for complete search history.

(56) References Cited

U.S. PATENT DOCUMENTS

| | | | |
|---|---|---|---|
| 4,847,673 A | 7/1989 | Matsukawa | |
| 5,316,978 A * | 5/1994 | Boyd et al. | 438/382 |
| 5,362,669 A | 11/1994 | Boyd et al. | |
| 6,074,940 A * | 6/2000 | Lee et al. | 438/601 |
| 6,417,093 B1 | 7/2002 | Xie et al. | |
| 6,498,385 B1 | 12/2002 | Daubenspeck et al. | |
| 6,534,374 B2 * | 3/2003 | Johnson et al. | 438/381 |
| 6,559,047 B1 | 5/2003 | Doohan | |
| 6,570,239 B2 | 5/2003 | Sakakibara et al. | |
| 6,734,076 B1 * | 5/2004 | Jaiswal et al. | 438/384 |
| 6,737,326 B2 | 5/2004 | Steinmann et al. | |
| 6,770,564 B1 | 8/2004 | Ito et al. | |
| 6,933,186 B2 * | 8/2005 | Cotte et al. | 438/190 |
| 7,323,751 B2 * | 1/2008 | Beach et al. | 257/359 |
| 2004/0245575 A1 * | 12/2004 | Beach et al. | 257/359 |

\* cited by examiner

*Primary Examiner* — Steven Loke
*Assistant Examiner* — David Goodwin
(74) *Attorney, Agent, or Firm* — Eugene C. Conser; Wade J. Brady, III; Frederick J. Telecky, Jr.

(57) ABSTRACT

A system and method is disclosed for manufacturing thin film resistors using a trench and chemical mechanical polishing. A trench is etched in a layer of dielectric material and a thin film resistor layer is deposited so that the thin film resistor layer lines the trench. A thin film resistor protection layer is then deposited to fill the trench. Then a chemical mechanical polishing process removes excess portions of the thin film resistor layer and the thin film resistor protection layer. An interconnect metal is then deposited and patterned to create an opening over the trench. A central portion of the thin film resistor protection material is removed down to the thin film resistor layer at the bottom of the trench. The resulting structure is immune to the effects of topography on the critical dimensions (CDs) of the thin film resistor.

20 Claims, 8 Drawing Sheets

| FIG. 16 (PRIOR ART) | FIG. 17 |
|---|---|
| D2 TEOS DEPOSITION | D2 TEOS DEPOSITION |
| CMP | CMP |
| USG DEPOSITION | USG DEPOSITION |
| WINDOW MASK | WINDOW MASK |
| WINDOW WET ETCH | WINDOW WET ETCH |
| WINDOW PLASMA ETCH | WINDOW PLASMA ETCH |
| PLASMA ASH | PLASMA ETCH |
| SOLVENT STRIP | SOLVENT STRIP |
|  | SiCCr OXIDE TRENCH MASK |
|  | SiCCr OXIDE TRENCH ETCH |
|  | ASH |
|  | SOLVENT STRIP |
| SiCCr DEPOSITION | SiCCr DEPOSITION |
| RESISTOR MASK |  |
| RESISTOR ETCH |  |
| SOLVENT STRIP NO. 1 |  |
| SOLVENT STRIP NO. 2 |  |
| TiW RESISTOR PROTECT DEP | TiW RESISTOR PROTECT DEP |
| TiW SCRUB | METAL CMP |
| TiW RESISTOR PROTECT MASK |  |
| RESISTOR PROTECT ETCH |  |
| ASH |  |
| SOLVENT STRIP |  |
| VIA 1 MASK | VIA 1 MASK |
| VIA PLASMA ETCH | VIA PLASMA ETCH |
| PLASMA ASH | PLASMA ASH |
| SOLVENT STRIP | SOLVENT STRIP |
| METAL-2 DEP A | METAL-2 DEP A |
| METAL SCRUB | METAL SCRUB |
| TUNGSTEN DEPOSITION | TUNGSTEN DEPOSITION |
| METAL SCRUB | METAL SCRUB |
| METAL-2 DEP B | METAL-2 DEP B |
| METAL 2 MASK | METAL 2 MASK |
| METAL 2 ETCH | METAL 2 ETCH |
| PLASMA ASH | PLASMA ASH |
| SOLVENT STRIP | SOLVENT STRIP |
| WET TiW ETCH | WET TiW ETCH |

SYSTEM AND METHOD FOR MANUFACTURING THIN FILM RESISTORS USING A TRENCH AND CHEMICAL MECHANICAL POLISHING

This application is a divisional of prior U.S. patent application Ser. No. 10/912,659 filed on Aug. 5, 2004 now U.S. Pat. No. 7,291,525.

TECHNICAL FIELD OF THE INVENTION

The present invention is generally directed to manufacturing technology for semiconductor devices and, in particular, to a system and method for manufacturing thin film resistors.

BACKGROUND OF THE INVENTION

Thin film resistor technology is widely used in the semiconductor manufacturing industry. The prior art methods that are currently available for patterning thin film resistors suffer from the effects of topography on the critical dimensions (CDs) of the thin film resistor. In addition, some prior art methods for patterning thin film resistors create metal "stringers" that are capable of electrically shorting the thin film resistors. For example, consider the structure of the prior art thin film resistor shown below in FIGS. 1-6.

FIG. 1 illustrates a cross sectional view of a prior art semiconductor device 100 comprising a thin film resistor (TFR) 120. To create semiconductor device 100 a substrate of dielectric material 110 was provided as shown in FIG. 1. A layer of thin film resistor (TFR) material 120 was deposited on the dielectric material 110 and then masked (photolithography) and etched. A layer of thin film resistor (TFR) protection material 130 (e.g., titanium tungsten) was deposited over the thin film resistor (TRF) 120. The layer of TFR protection material 130 (and portions of the dielectric substrate 110) were then etched and a first titanium/titanium nitride (Ti/TiN) liner 140 was deposited. Then a layer of tungsten (W) 150 was deposited to cover the first titanium/titanium nitride (Ti/TiN) liner 140.

Then a tungsten etch back process is applied to etch away the tungsten layer 150 down to the first titanium/titanium nitride (Ti/TiN) liner 140. The result of applying the tungsten etch back process is shown in FIG. 2. Spacers (also known as "stringers") of tungsten material 150 remain adjacent to the vertical edges of the portion of the first titanium/titanium nitride (Ti/TiN) liner 140 that is located over the TFR protection material 130 over the thin film resistor 120.

Then a second titanium/titanium nitride (Ti/TiN) liner 310 is deposited over the first titanium/titanium nitride (Ti/TiN) liner 140 and over the spacers 150 of tungsten material. A metal layer 320 (e.g., aluminum) is then deposited over the second titanium/titanium nitride (Ti/TiN) liner 310. The result of these steps is illustrated in FIG. 3.

Then a metal etch process is applied to etch the metal layer 320. FIG. 4 illustrates the result of applying the metal etch process. The metal layer 320 is etched away. The "stringers" of tungsten material 150 are etched away. The second titanium/titanium nitride (Ti/TiN) liner 310 is also etched away. Except for the "stringers" 140 that remain on ridges of the dielectric material 110 (as shown in FIG. 4) the first titanium/titanium nitride (Ti/TiN) liner 140 is also etched away.

Then a titanium tungsten (TiW) etch process is applied to etch away the TFR protection material 130 over the thin film resistor (TFR) material 120. The result is shown in FIG. 5. The "stringers" 140 of the first titanium/titanium nitride (Ti/TiN) liner 140 shown in FIG. 4 also remain in FIG. 5.

FIG. 6 illustrates a plan view of the prior art semiconductor device shown in FIG. 5. A first end of the thin film resistor (TFR) material 120 is connected to a first metal contact pad 610. A second end of the thin film resistor (TFR) material 120 is connected to a second metal contact pad 620. The ends of the "stringers" 140 are also connected to first metal contact pad 610 and to second metal contact pad 620. The problem is that the titanium/titanium nitride "stringers" 140 electrically short the thin film resistor (TFR) material 120 between the metal contact pads, 610 and 620.

Therefore, there is a need in the art for a system and method that is capable of patterning a thin film resistor in a manner that does not create the problems inherent in prior art methods. In particular there is a need in the art for a system and method for patterning a thin film resistor that is immune to the effects of topography on the critical dimensions (CDs) of the thin film resistor.

SUMMARY OF THE INVENTION

To address the above-discussed deficiencies of the prior art, it is a primary object of the present invention to provide an efficient system and method for manufacturing a thin film resistor.

In one advantageous embodiment of the present invention a trench is etched in a layer of dielectric material. Then a thin film resistor layer is deposited so that the thin film resistor layer lines the trench that has been etched in the layer of dielectric material. Then a thin film resistor protection layer is deposited to fill the trench.

Then a chemical mechanical polishing process is applied to remove the excess portions of the thin film resistor layer and to remove the excess portions the thin film resistor protection layer. Then an interconnect metal is deposited and patterned to create an opening over the thin film protection layer in the trench. Then a central portion of the thin film resistor protection layer is removed down to the thin film resistor layer that is located at the bottom of the trench.

The resulting thin film resistor structure is immune to the effects of topography on the critical dimensions (CDs) of the thin film resistor. In addition, the resulting thin film resistor structure does not create metal "stringers" that can electrically short out the thin film resistor.

It is an object of the present invention to provide an efficient system and method for manufacturing a thin film resistor.

It is also an object of the present invention to provide a system and method for manufacturing a thin film resistor to eliminate the effects of topography on the critical dimensions (CDs) of the thin film resistor.

It is yet another object of the present invention to provide a system and method for manufacturing a thin film resistor in which metal "stringers" are eliminated from the structures associated with the thin film resistor.

It is still another object of the present invention to provide a system and method for manufacturing a thin film resistor in which a chemical mechanical polishing process is used instead of a mask and etch process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 16 illustrates a prior art sequence of steps of a method for manufacturing a prior art thin film resistor in which the method employs five mask steps; and FIG. 17 illustrates a sequence, of steps of an exemplary method of the present invention for manufacturing a thin film resistor in which the method employs four mask steps.

DETAILED DESCRIPTION OF THE INVENTION

FIGS. 7 through 17, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Figure 1:
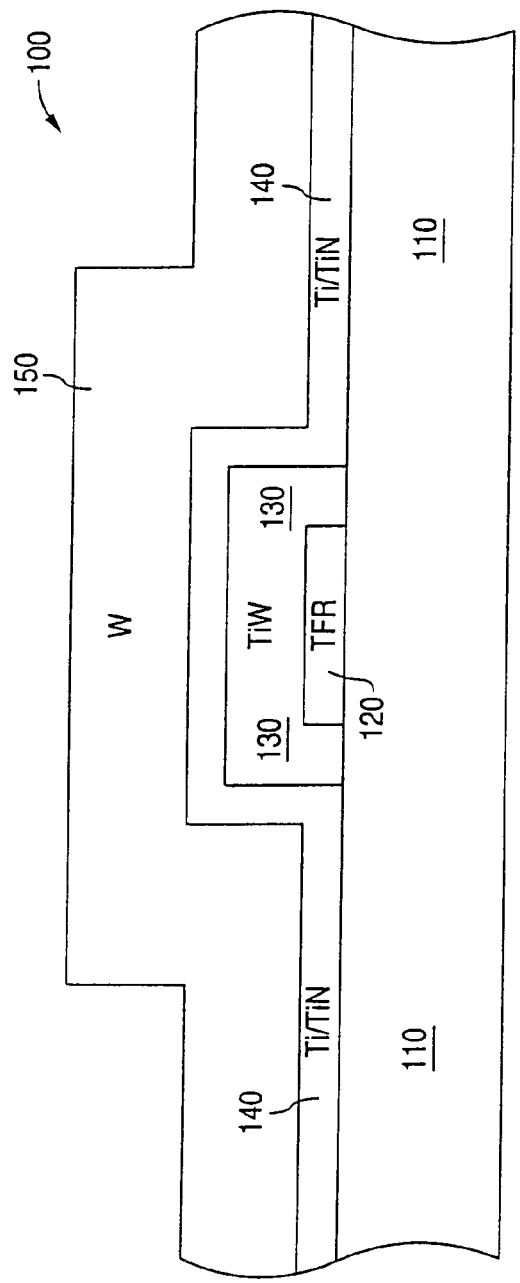
FIG. 1 illustrates a cross sectional view of a prior art semiconductor device comprising a thin film resistor (TFR) located within a substrate of dielectric material in which an upper surface of the thin film resistor is covered with a TFR protection material made of titanium tungsten, and in which first titanium/titanium nitride (Ti/TiN) liner covers the TFR protection material and portions of the dielectric substrate, and in which a layer of tungsten (W) covers the first titanium/titanium nitride (Ti/TiN) liner.
Figure 2:
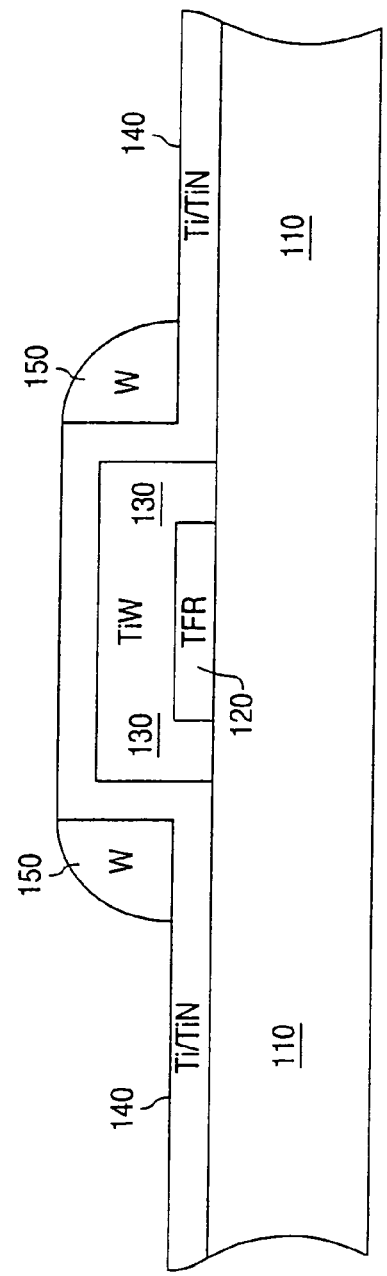
FIG. 2 illustrates a cross sectional view of the prior art semiconductor device shown in FIG. 1 after the application of a tungsten etch back process.
Figure 3:
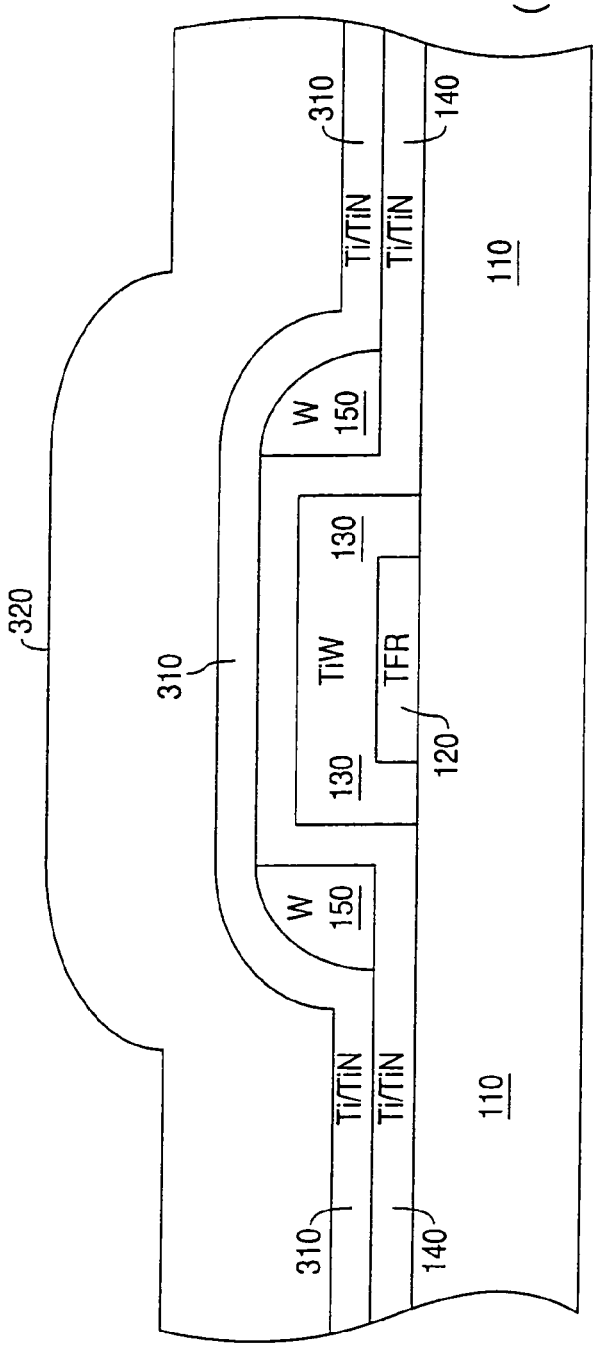
FIG. 3 illustrates a cross sectional view of the prior art semiconductor device shown in FIG. 2 after the deposition of a second titanium/titanium nitride (Ti/TiN) liner and the deposition of a metal layer.
Figure 4:
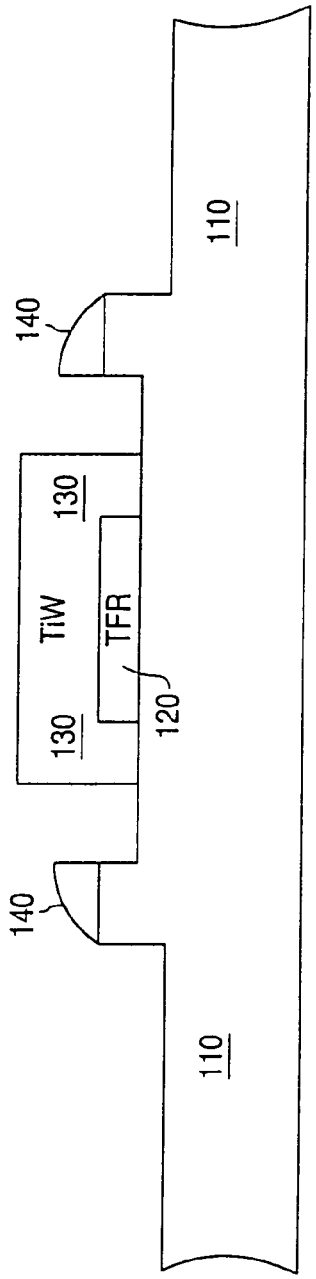
FIG. 4 illustrates a cross sectional view of the prior art semiconductor device shown in FIG. 3 after the application of a metal etch process.
Figure 5:
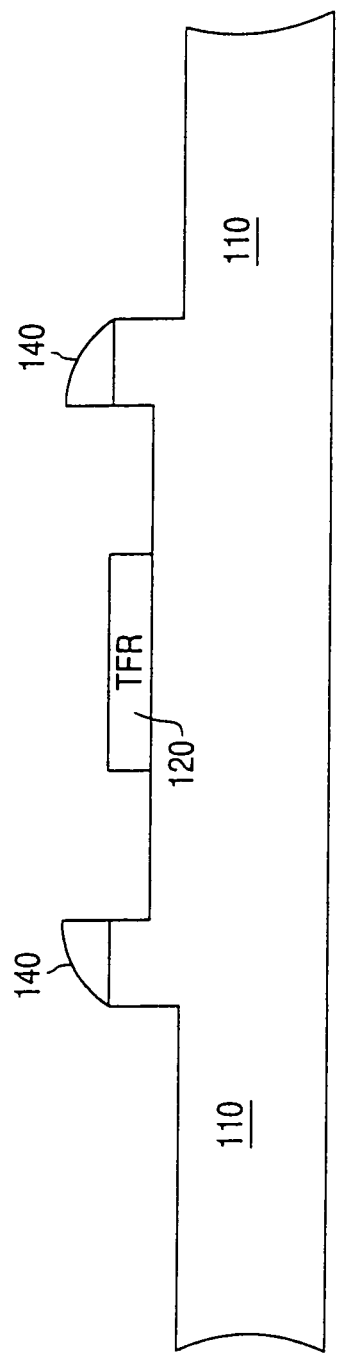
FIG. 5 illustrates a cross sectional view of the prior art semiconductor device shown in FIG. 4 after the application of a titanium tungsten etch process.
Figure 6:
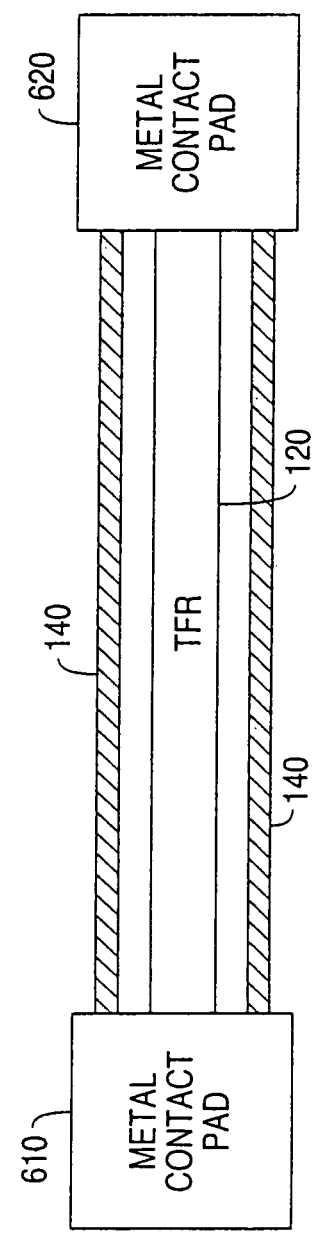
FIG. 6 illustrates a plan view of the prior art semiconductor device shown in FIG. 5 connected to metal contact pads.
Figure 7:
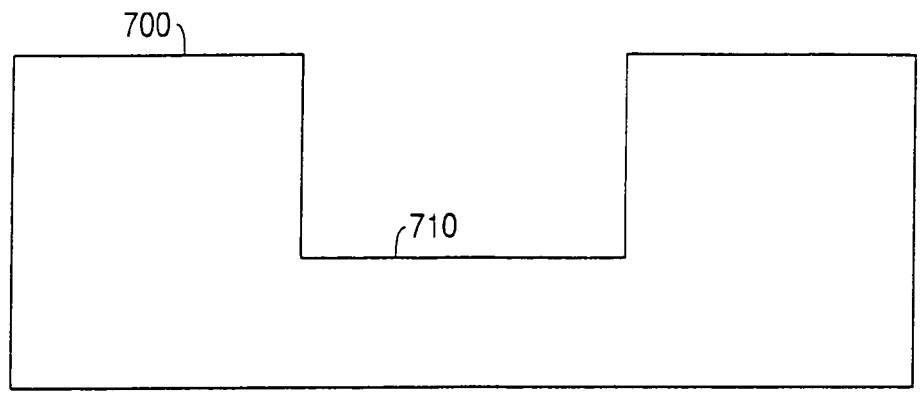
FIG. 7 illustrates a dielectric substrate layer in which a trench has been etched for constructing a thin film resistor of the present invention.

FIGS. 7 through 12 illustrate stages in the construction of a thin film resistor (TFR) of the present invention. As shown in FIG. 7, a substrate layer 700 of dielectric material is provided. The dielectric substrate layer 700 is partially covered with a mask (not shown) and a trench 710 is etched in time dielectric substrate layer 700 to receive the thin film resistor of the present invention.

Figure 8:
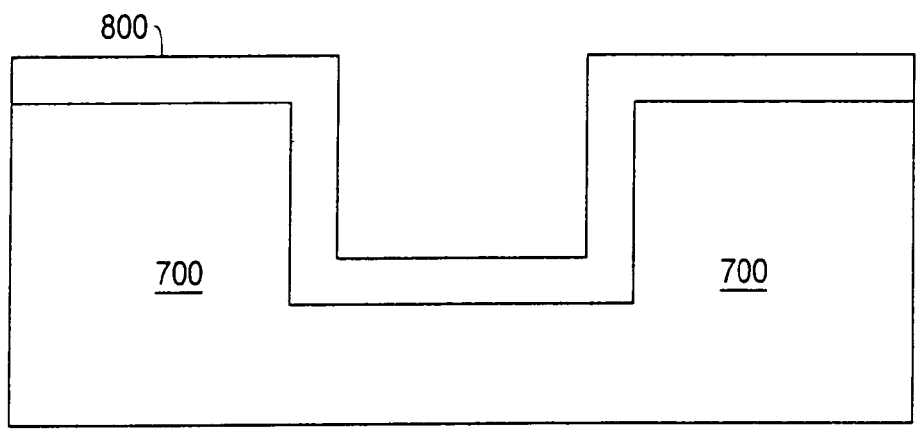
FIG. 8 illustrates the thin film resistor structure of the present invention shown in FIG. 7 after the deposition of a layer of thin film resistor (TFR) material.

Then a layer of thin film resistor (TFR) material 800 is deposited over the substrate layer 700. The thin film resistor (TFR) material 800 covers the surface of substrate layer 700 (including the surfaces of trench 710) as shown in FIG. 8. The thin film resistor (TFR) material 800 may comprise any suitable thin film resistor material used in the semiconductor industry, including, without limitation, silicon carbide chrome (SiCCr), silicon chromium (SiCr), nickel chromium (NiCr), chromium silicide ($CrSi_2$), chromium silicon nitride (CrSiN), tantalum nitride (TaN), and tantanlum silicide ($Ta_2Si$).

Figure 9:
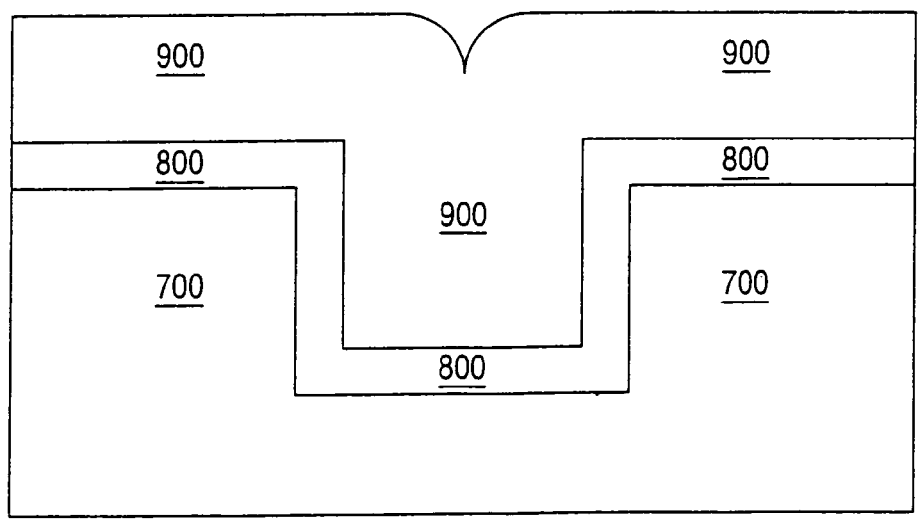
FIG. 9 illustrates the thin film resistor structure of the present invention shown in FIG. 8 after the deposition of a layer of thin film resistor (TFR) protection material.

After the thin film resistor (TFR) material 800 has been deposited, then a layer of thin film resistor protection material 900 is deposited over the thin film resistor (TFR) material 800. The thin film resistor protection material 900 covers the surface of the thin film resistor (TFR) material 800 as shown in FIG. 9. The thin film resistor protection material 900 may comprise any suitable thin film resistor protection material used in the semiconductor industry, including, without limitation, silicon dioxide ($SiO_2$), silicon nitride ($Si_3N_4$), aluminum (Al), titanium tungsten (TiW), tungsten (W) and titanium nitride (TiN).

Figure 10:
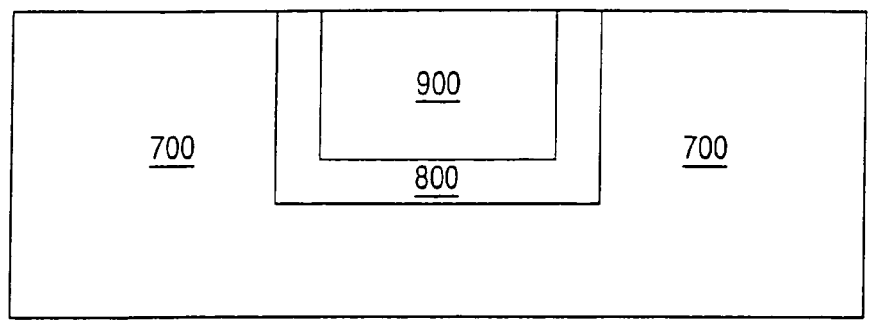
FIG. 10 illustrates the thin film resistor structure of the present invention shown in FIG. 9 after the application of a chemical mechanical polishing (CMP) process.

Then a chemical mechanical polishing (CMP) process is applied to remove the thin film resistor protection material 900 that is not located within the trench and to remove the thin film resistor (TFR) material 800 that is not located within the trench. The result of applying the chemical mechanical polishing (CMP) process is shown in FIG. 10. The chemical mechanical polishing (CMP) process has removed the lateral portions of the thin film resistor (TFR) material 800 down to the dielectric substrate layer 700.

The portions of the thin film resistor (TFR) material 800 in the trench 710 (that are not touched by the chemical mechanical polishing (CMP) process) form a trench liner in trench 710. Thin film resistor protection material 900 on top of the thin film resistor (TFR) material 800 fills trench 710. The thin film resistor (TFR) material 800 that forms the trench liner separates the thin film resistor protection material 900 and the dielectric substrate 700.

Figure 11:
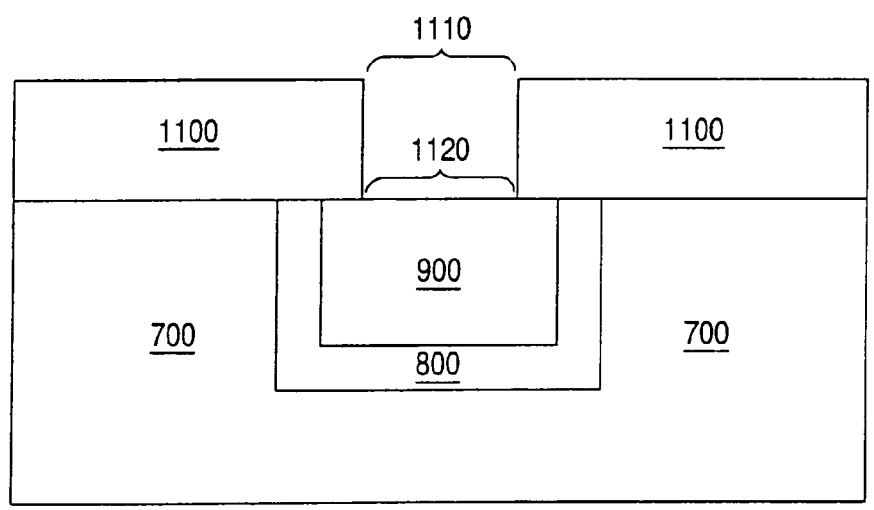
FIG. 11 illustrates the thin film resistor structure of the present invention shown in FIG. 10 after the deposition and patterning of an interconnect metal layer.

Then a layer of interconnect metal 1100 is deposited on top of the structure shown in FIG. 11. The interconnect metal 1100 may comprise any suitable interconnect metal used in the semiconductor industry, including, without limitation, aluminum metal.

The interconnect metal layer 1100 is partially covered with a mask (not shown) and an opening 1110 is etched in the interconnect metal layer 1100 exposing a portion 1120 of the thin film resistor protection layer 900. The result of applying the mask and etch process to the interconnect metal layer 1100 is shown in FIG. 11.

Figure 12:
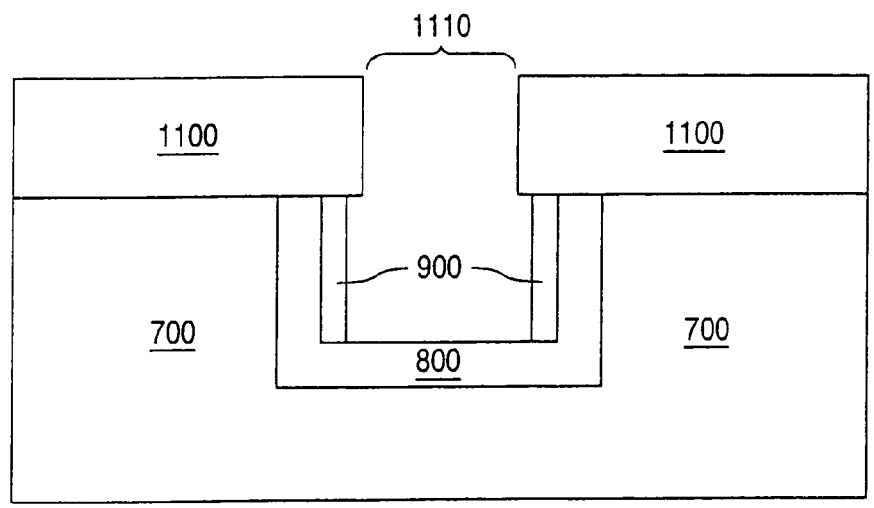
FIG. 12 illustrates the thin film resistor structure of the present invention shown in FIG. 11 after the removal of a central portion of the thin film resistor (TFR) protection material down to the thin film resistor (TFR) layer.

Then a central portion of the thin film resistor protection material 900 is removed to form an opening 1210 through the thin film resistor protection material 900 down to the thin film resistor (TFR) material 800. The result of removing the central portion of the thin film resistor protection material 900 is shown in FIG. 12. The thin film resistor protection material 900 protects the vertical walls of the thin film resistor (TFR) material 800 and forms the electrical contact between the interconnect metal layer 1100 and the thin film resistor (TFR) material 800.

The thin film resistor structure of the present invention shown in FIG. 12 eliminates the topographical effects on the critical dimensions of the thin film resistor. The thin film structure of the present invention shown in FIG. 12 also eliminates the metal "stringers" that create problems in the prior art thin film resistors.

Figure 13:
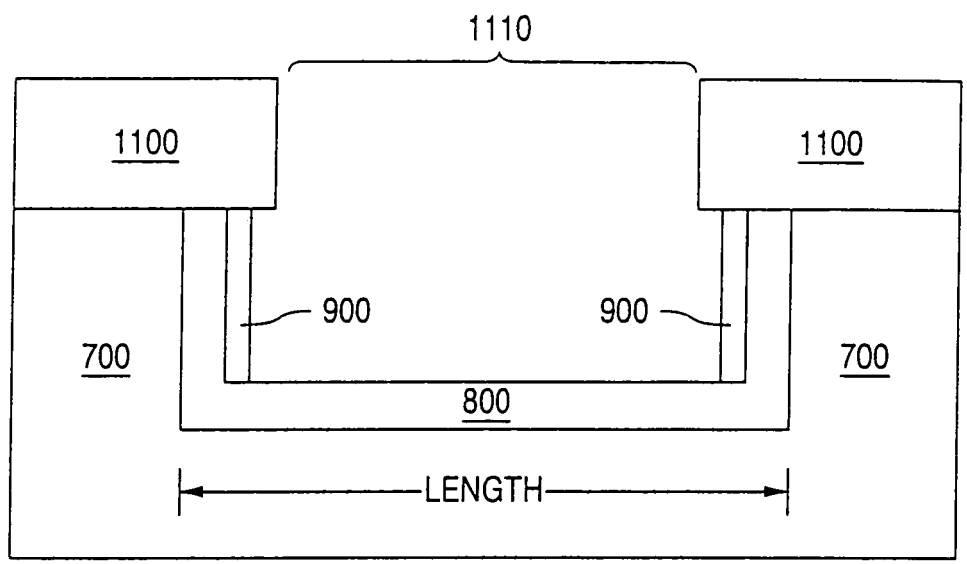
FIG. 13 illustrates the thin film resistor structure of the present invention shown in FIG. 12 showing a cross sectional view of the length of the thin film resistor structure.
Figure 14:
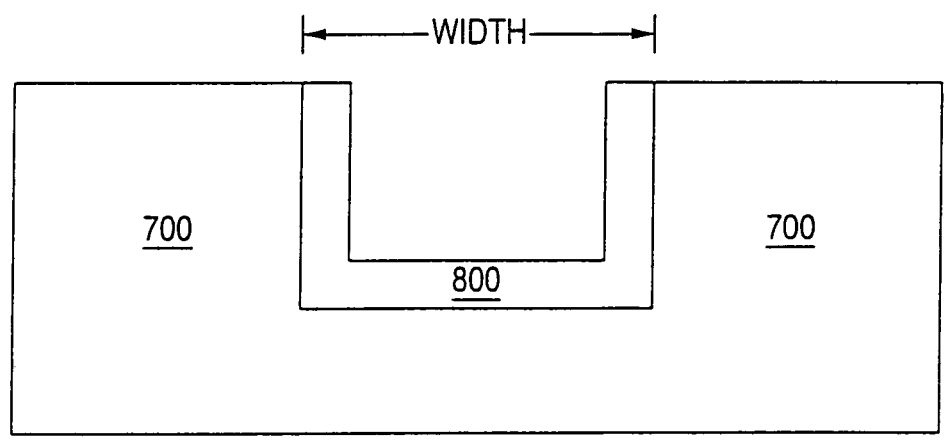
FIG. 14 illustrates the thin film resistor structure of the present invention shown in FIG. 12 showing a cross sectional view of the width of the thin film resistor structure.

FIG. 13 illustrates a cross sectional view of the length of the thin film resistor structure of the present invention. FIG. 13 illustrates the fact that the value of the length of the thin film resistor structure of the present invention that is shown in FIG. 12 may be selected depending upon the design requirements for the thin film resistor. FIG. 14 illustrates a cross sectional view of the thin film resistor structure of the present invention shown in FIG. 13.

Figure 15:
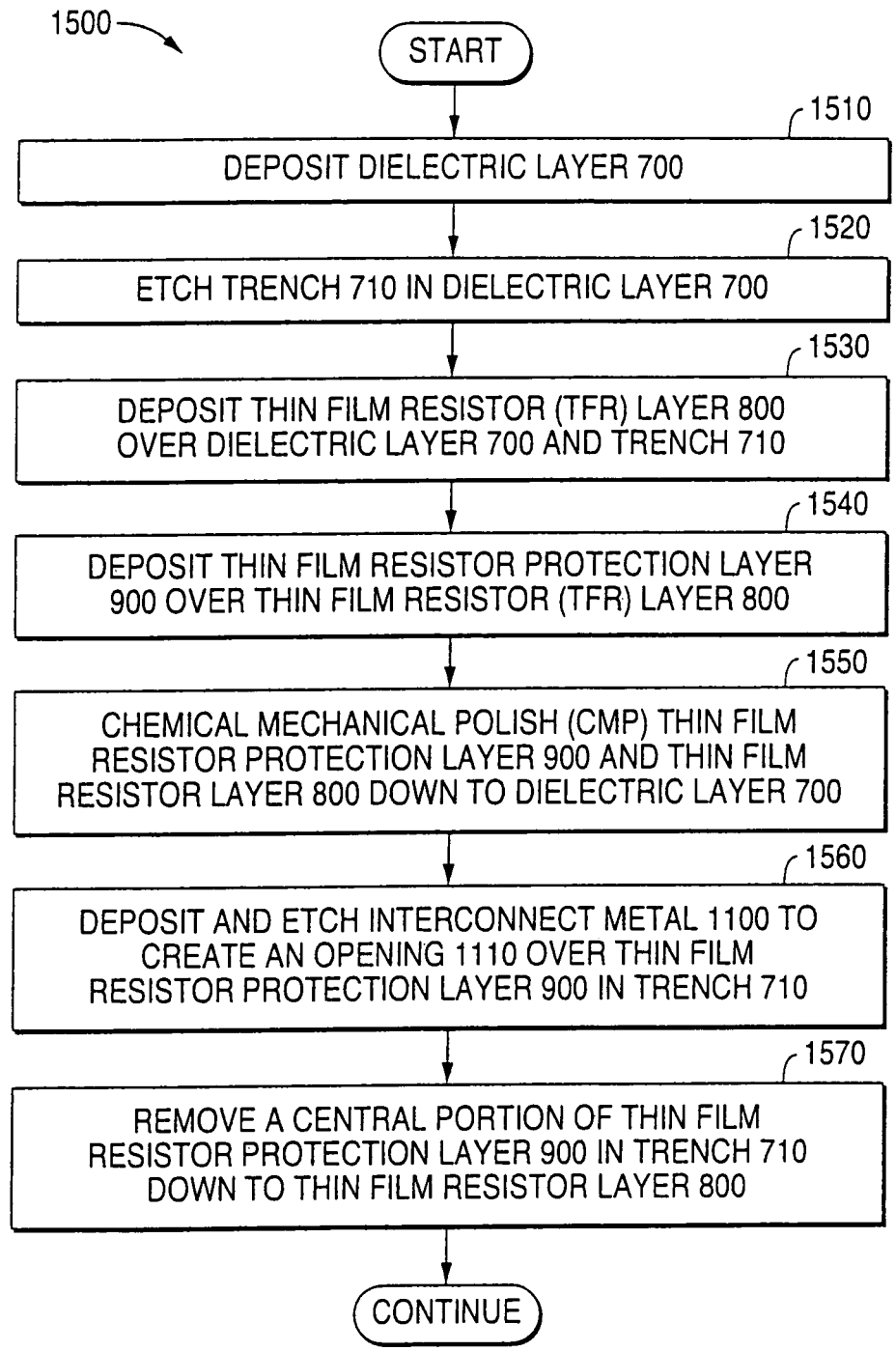
FIG. 15 illustrates a flow chart showing the steps of an advantageous embodiment of the method of the present invention.

FIG. 15 illustrates a flow chart 1500 showing the steps of an advantageous embodiment of the method of the present invention for manufacturing a thin film resistor. In the first step a dielectric layer 700 is deposited (step 1510). Then a mask and etch process is applied to etch a trench 710 in the dielectric layer 700 (step 1520). Then a thin film resistor (TFR) layer 800 is deposited over the dielectric layer 700 and the trench 710 (step 1530).

Then a thin film resistor protection layer 900 is deposited over the thin film resistor (TFR) layer 800 (step 1540). Then a chemical mechanical polishing (CMP) process is applied to polish the thin film resistor protection layer 900 and the thin film resistor (TFR) layer 800 down to the dielectric layer 700 (step 1550). Then an interconnect metal 1100 is deposited and etched to create an opening 1110 over the thin film resistor protection layer 900 in trench 710 (step 1560). Then a central portion of the thin film resistor protection layer 900 in trench 710 is removed down to the thin film resistor layer 800 (step 1570). This method forms the structure of the thin film resistor (TFR) of the present invention.

The method of the present invention also eliminates a relatively expensive mask step from the prior art method and replaces it with a relatively inexpensive chemical mechanical polishing (CMP) step. For example, consider the prior art sequence of steps shown in FIG. 16 for manufacturing a thin film resistor. The prior art method shown in FIG. 16 employs five mask steps. The five mask steps are: (1) Window Mask, (2) Resistor Mask, (3) TiW Resistor Protect Mask, (4) Via 1 Mask, and (5) Metal 2 Mask. These five mask steps are shown in FIG. 16 surrounded with a bold border.

Now consider the sequence of steps shown in FIG. 17 for manufacturing a thin film resistor in accordance with the principles of the present invention. The method of the present invention shown in FIG. 17 employs four mask steps. The four mask steps are: (1) Window Mask, (2) SiSCCr Oxide Trench Mask, (3) Via 1 Mask, and (4) Metal 2 Mask. These four mask steps are shown in FIG. 17 surrounded with a bold border. A comparison of FIG. 16 and FIG. 17 shows that the method of the present invention uses a relatively inexpensive chemical mechanical polishing (CMP), step instead of a relatively expensive mask step. The method of the present invention may be used to insert a thin film resistor (TFR) module at any dielectric layer.

The prior art method also utilizes photoresist and plasma etching to pattern the thin film resistor. The method of the present invention eliminates the difficulty of stripping the photoresist layer without using an oxygen ($O_2$) plasma.

Although the present invention has been described with an exemplary embodiment, various changes and modifications may be suggested to one skilled in the art. It is intended that the present invention encompass such changes and modifications as fall within the scope of the appended claims.

What is claimed is:
1. A thin film resistor apparatus manufactured by:
   etching a trench in a layer of dielectric material, the trench having a plurality of vertical walls and a bottom;
   depositing a thin film resistor layer on said layer of dielectric material, wherein said thin film resistor layer covers said trench in said layer of dielectric material;
   depositing a thin film resistor protection layer on said thin film resistor layer;
   applying a chemical mechanical polishing process to remove a first portion of said thin film resistor protection layer and portions of said thin film resistor layer down to said layer of dielectric material; and
   removing a second portion of said thin film resistor protection layer within said trench, wherein remaining portions of said thin film resistor protection layer are on the plurality of vertical walls of said trench and not on a central portion of the bottom of said trench.

2. The thin film resistor as set forth in claim 1 wherein said thin film resistor layer comprises one of: silicon carbide chrome (SiCCr), silicon chromium (SiCr), nickel chromium (NiCr), chromium silicide (CrSi2), chromium silicon nitride (CrSiN), tantalum nitride (TaN), and tantalum silicide (Ta2Si).

3. The thin film resistor as set forth in claim 1 wherein said thin film resistor protection layer comprises one of: silicon dioxide (SiO2), silicon nitride (Si3N4), aluminum (Al), titanium tungsten (TiW), tungsten (W), and titanium nitride (TiN).

4. The thin film resistor as set forth in claim 1 wherein said thin film resistor is further manufactured by:

depositing a layer of interconnect metal over said layer of dielectric material and over said trench filled with said thin film resistor layer and said thin film resistor protection layer; and etching said layer of interconnect metal to create an opening over said thin film resistor protection layer within said filled trench.

5. The thin film resistor as set forth in claim 1 wherein removing said second portion of said thin film resistor protection layer comprises removing a central portion of said thin film resistor protection layer down to said thin film resistor layer located at the bottom of said trench in said dielectric material.

6. The thin film resistor as set forth in claim 4, wherein said remaining portions of said thin film resistor protection layer comprise a third portion of said thin film resistor protection layer located adjacent to a first side of said interconnect metal layer and a fourth portion of said thin film resistor protection layer located adjacent to a second side of interconnect metal layer.

7. A thin film resistor apparatus manufactured by only four mask steps, wherein said four mask steps comprise: (1) a window mask step, (2) a trench mask step, (3) a via mask step, and (4) a metal mask step;

wherein the thin film resistor apparatus comprises a layer of dielectric material having a trench etched therein, the trench having a plurality of vertical walls and a bottom; and wherein a thin film resistor protection layer is deposited in the trench and etched such that the plurality of vertical walls of the trench are coated by the thin film resistor protection layer and a central portion of the bottom of the trench is not coated by the thin film resistor protection layer.

8. The thin film resistor apparatus as set forth in claim 7, wherein said thin film resistor apparatus is further manufactured by:

etching said trench in said layer of dielectric material;

depositing a thin film resistor layer on said layer of dielectric material, wherein said thin film resistor layer covers said trench in said layer of dielectric material;

depositing said thin film resistor protection layer on said thin film resistor layer, wherein said thin film resistor protection layer fills said trench;

applying a chemical mechanical polishing process to remove a first portion of said thin film resistor protection layer and portions of said thin film resistor layer down to said layer of dielectric material; and removing a second portion of said thin film resistor protection layer, wherein remaining portions of said thin film resistor protection layer are on the plurality of vertical walls of said trench and not on the central portion of the bottom of said trench.

9. The thin film resistor apparatus as set forth in claim 8 wherein said thin film resistor layer comprises one of: silicon carbide chrome (SiCCr), silicon chromium (SiCr), nickel chromium (NiCr), chromium silicide (CrSi2), chromium silicon nitride (CrSiN), tantalum nitride (TaN), and tantalum silicide (Ta2Si).

10. The thin film resistor apparatus as set forth in claim 8 wherein said thin film resistor protection layer comprises one of: silicon dioxide (SiO2), silicon nitride (Si3N4), aluminum (Al), titanium tungsten (TiW), tungsten (W), and titanium nitride (TiN).

11. The thin film resistor apparatus as set forth in claim 8, wherein said thin film resistor apparatus is further manufactured by:

depositing a layer of interconnect metal over said layer of dielectric material and over said trench filled with said thin film resistor layer and said thin film resistor protection layer.

12. The thin film resistor apparatus as set forth in claim 11, wherein said thin film resistor apparatus is further manufactured by:

etching said layer of interconnect metal to create an opening over said thin film resistor protection layer within said filled trench.

13. The thin film resistor apparatus as set forth in claim 8, wherein removing said second portion of said thin film resistor protection layer comprises removing a central portion of said thin film resistor protection layer down to said thin film resistor layer located at the bottom of said trench in said dielectric material.

14. The thin film resistor apparatus as set forth in claim 12, wherein said remaining portions of said thin film resistor protection layer comprise a third portion of said thin film resistor protection layer located adjacent to a first side of said interconnect metal layer and a fourth portion of said thin film resistor protection layer located adjacent to a second side of said interconnect metal layer.

15. A thin film resistor apparatus, comprising:

a layer of dielectric material having a trench etched therein, the trench having a plurality of vertical walls and a bottom;

a thin film resistor layer on the layer of dielectric material wherein the thin film resistor layer covers the trench in the layer of dielectric material; and a thin film resistor protection layer on the thin film resistor layer, wherein the thin film resistor protection layer is located on the plurality of vertical walls of said trench and not on a central portion of the bottom of said trench.

16. The thin film resistor apparatus as set forth in claim 15 wherein said thin film resistor layer comprises one of: silicon carbide chrome (SiCCr), silicon chromium (SiCr), nickel chromium (NiCr), chromium silicide (CrSi2), chromium silicon nitride (CrSiN), tantalum nitride (TaN), and tantalum silicide (Ta2Si).

17. The thin film resistor apparatus as set forth in claim 16 wherein said thin film resistor protection layer comprises one of: silicon dioxide (SiO2), silicon nitride (Si3N4), aluminum (Al), titanium tungsten (TiW), tungsten (W), and titanium nitride (TiN).

18. The thin film resistor apparatus as set forth in claim 17 further comprising:

a layer of interconnect metal over the layer of dielectric material and over the trench containing the thin film resistor layer and the thin film resistor protection layer, wherein the layer of interconnect metal is etched to create an opening over the trench.

19. The thin film resistor apparatus as set forth in claim 18 wherein the thin film resistor protection layer is formed by removing a portion of the thin film resistor protection layer down to the thin film resistor layer located at the bottom of the trench in the dielectric material.

20. The thin film resistor apparatus as set forth in claim 19, wherein remaining portions of the thin film resistor protection layer comprise a first portion of thin film resistor protection layer located adjacent to a first side of the interconnect metal layer.

* * * * *